United States Patent [19]

Dunsmore

[11] Patent Number: 5,028,131
[45] Date of Patent: Jul. 2, 1991

[54] LIGHTWAVE TEST SET FOR AN RF NETWORK ANALYZER SYSTEM

[75] Inventor: Joel P. Dunsmore, Sebastopol, Calif.

[73] Assignee: Hewlett-Packard Company, Palo Alto, Calif.

[21] Appl. No.: 391,337

[22] Filed: Aug. 8, 1989

[51] Int. Cl.⁵ .......................................... G01N 21/01
[52] U.S. Cl. ................................... 356/73.1; 356/72
[58] Field of Search ............................. 356/73.1, 72; 364/571.04; 434/224

[56] References Cited

U.S. PATENT DOCUMENTS 4,816,767  3/1989  Cannon et al. ............... 364/571.04
4,875,859 10/1989  Wong et al. ...................... 434/224

Primary Examiner—Vincent P. McGraw
Assistant Examiner—LaCharles P. Keesee
Attorney, Agent, or Firm—William C. Milks, III

[57] ABSTRACT

A lightwave test set interconnected to an existing RF vector or scalar network analyzer system for performing calibrated electro-optical, opto-electrical, optical, and/or electrical measurements on optical systems, subsystems, and associated components.

3 Claims, 22 Drawing Sheets

LIGHTWAVE TEST SET FOR AN RF NETWORK ANALYZER SYSTEM

BACKGROUND OF THE INVENTION

This invention relates to electronic test instruments for measuring high frequency signals and, more particularly, to lightwave testing systems. Specifically, the invention provides in one embodiment a measurement solution for characterizing high-speed lightwave systems, subsystems, and associated components within research and development, as well as manufacturing, environments by means of a lightwave test set connected to an extant vector or scalar network analyzer system.

Many users have existing network analyzers, such as an HP 8510 vector network analyzer system available from Hewlett-Packard Company, Network Measurements Division, Santa Rosa, Calif. Many such users may wish to invest only incrementally in lightwave testing. Moreover, various users want and need HP 8510 vector network analyzer system capabilities in lightwave testing. Also some users may desire an economical solution to lightwave testing through use of a scalar network analyzer such as an HP 8757 scalar network analyzer system.

SUMMARY OF THE INVENTION

The invention provides in one embodiment a 26.5 GHz general purpose lightwave test set for use with existing and future RF vector and scalar network analyzer systems. This enables users to capitalize on available lightwave source and receiver technology to quickly respond to lightwave testing needs.

One embodiment of the present invention provides 26.5 GHz modulation bandwidth measurements of electro-optical, opto-electrical, and/or optical systems, subsystems, and associated components with existing RF network analyzer systems when combined with a lightwave test set. Possible network analyzer systems include the HP 8510, HP 8720/Option H80, HP 8719/Option H80, or HP 8757. An external controller coordinates the analyzer and lightwave test set to perform calibrated transmission and reflection measurements of lightwave devices under test, such as lasers, LEDs, photodiodes, optical regenerators, optical connectors, as well as RF devices under test, such as amplifiers and filters. Scientists and engineers can extend the capability of their RF network analyzers by combining them with the lightwave test set for performing lightwave testing.

Preferably, the lightwave test set in accordance with one embodiment of the invention has the same key measurement capabilities as an integrated lightwave component analyzer with only a small degradation in specified performance when used with the HP 8510 vector network analyzer system having a firmware revision in the HP 8510 analyzer. It is less convenient for some measurements, since one or two more calibration steps may be needed. A BASIC controller is also required for complete calibrated lightwave testing. However, some simple calibrations may be possible without a controller, using instrument states saved on disk. Nevertheless, the lightwave test set can be less costly than an integrated lightwave component analyzer solution, not including the RF network analyzer.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings.

DETAILED DESCRIPTION OF THE PREFERRED EMBODIMENTS

Figure 1:
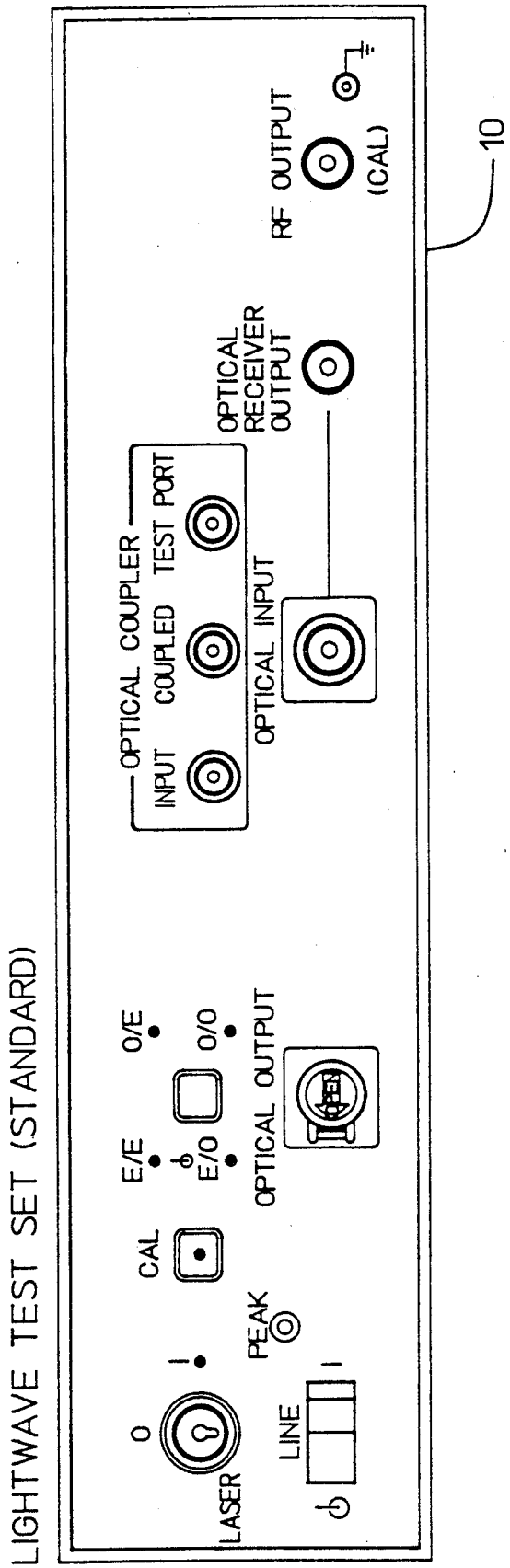
FIG. 1 is a plan view of a front panel of one embodiment of a lightwave test set in accordance with the invention.

A plan view of a front panel for one embodiment of a lightwave test set 10 in accordance with the invention, generally indicated by the numeral 10, is shown in FIG. 1.

Figure 2:
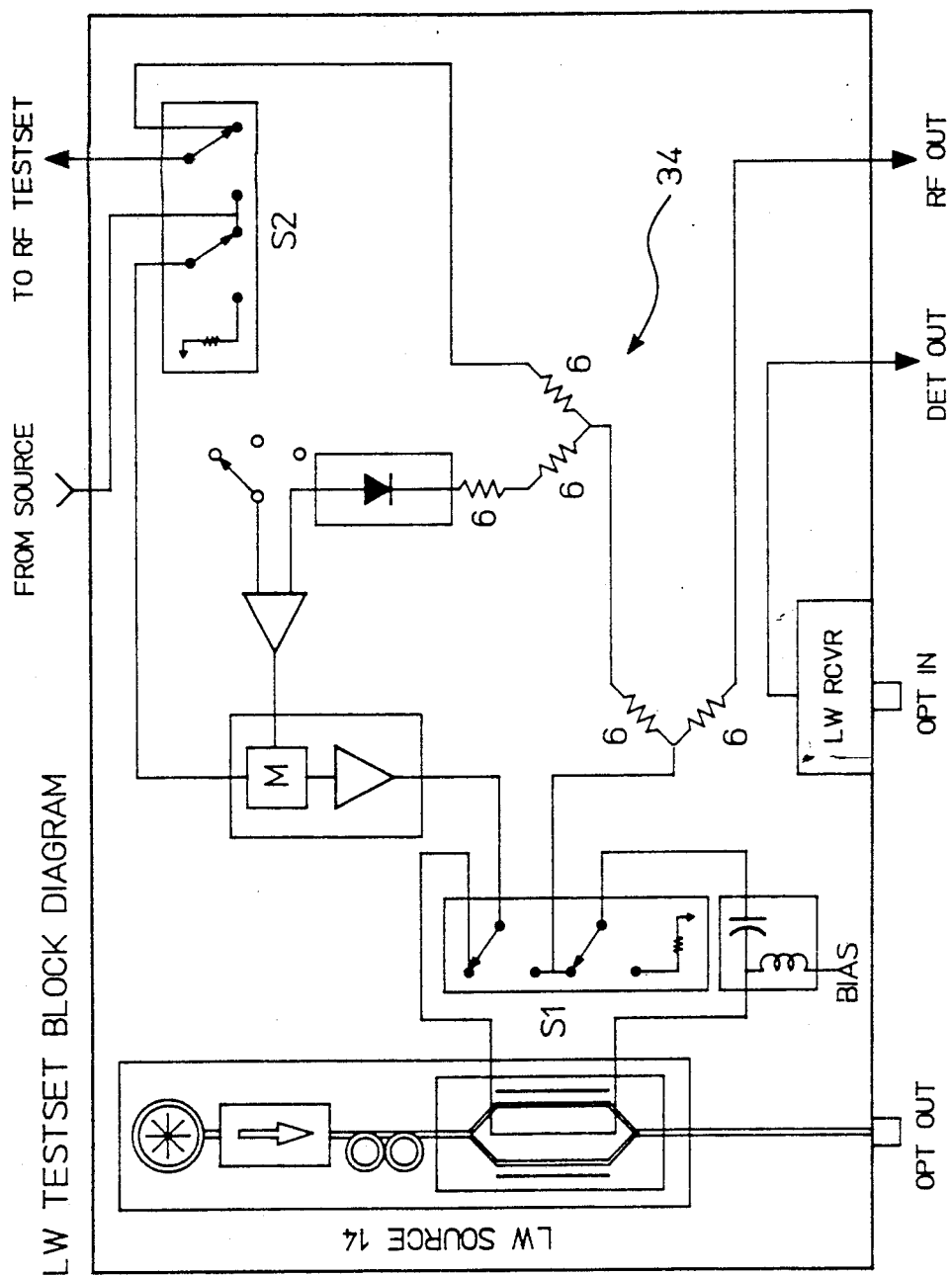
FIG. 2 is a block diagram of the lightwave test set shown in FIG. 1.

The block diagram for one embodiment of the lightwave test set 10 in accordance with the invention is shown in FIG. 2. The lightwave test set 10 preferably provides calibrated lightwave measurements at modulation frequencies from 45 MHz to 26.5 GHz. Typical dynamic range for lightwave forward transmission test is >40 dB and for lightwave reflection test is >40 dB. The lightwave test set 10 preferably has the same optical dynamic range in an HP 8510 vector network analyzer based system as the lightwave test set 12 or 12' disclosed in a co-pending U.S. patent application filed on Aug. 7, 1989, in the names of Paul R. Hernday, Roger W. Wong, and Hugo Vifian, entitled "LIGHTWAVE COMPONENT ANALYZER," the entire disclosure of which is hereby incorporated by reference. The lightwave test set 10 has very close to the same accuracy in frequency response and responsivity, with only minor degradation due to one or two connection uncertainties. The lightwave test set 10 provides high power +12 dBm RF output available to drive E/O devices, such as laser diodes.

The lightwave test set 10 is preferably structured similarly to the lightwave test set 12 or 12' disclosed in the aforementioned Hernday, et al., application. The lightwave test set 10 preferably comprises the same lightwave hardware, including a 1300 nm Fabry-Perot laser. In either case, a 1300 nm distributed feedback (DFB) laser or 1550 nm DFB laser can be substituted for the Fabry-Perot laser. The characteristics of these various lasers appear in Table I below. Furthermore, it is contemplated that an optional optical switch can be provided so that the user can use his own laser by allowing switching of an external lightwave source. The lightwave source 14 is preferably identical, and the RF drive hardware has nearly the same components.

TABLE I

| Laser Characteristics | | | |
|---|---|---|---|
| | Fabry-Perot Laser | 1550 nm DFB Laser | 1308 nm DFB Laser |
| Wavelength (nm) | 1308 ± 10 nm | 1550 ± 10 nm | 1308 ± 10 nm |
| RMS Spectral Width (Typical) | 3 nm | 60 MHz | 60 MHz |
| Average Optical Power (Typical) | 225 uW | 225 uW | 225 uW |
| Nominal Modulation Bandwidth | 130 MHz to 20 GHz | 130 MHz to 20 GHz | 130 MHz to 20 GHz |
| Modulated Power Out (Typical) | 250 uW | 250 uW | 250 uW |
| Compatible Fiber | 9/125 uW | 9/125 um | 9/125 um |

Differences include adding a power splitter, and deleting two attenuators, a d.c. block, and one optical detector. Nearly the same RF hardware is included. An optical coupler is also included for optical reflection measurements.

The operation of the RF portion, and its interaction with the interconnected network analyzer system are, however, quite different. The major differences are as follows.

There is an RF block diagram change to optimize performance with HP 8510 vector network analyzer systems. Only one optical receiver is available in the lightwave test set 10. The lightwave test set 10 requires a BASIC controller for calibrated E/O and O/E measurements. Some user direction in set up and calibration of measurements can be included.

The key differences between network analyzer systems, which require and allow these changes, is in the availability of the source and reference channel receiver. In the lightwave component analyzer disclosed in the aforementioned Hernday, et al., application, the electrical source 22 is preferably internal, and the reference channel is used to level the electrical source power. This leveled and already ratioed signal is sent to the lightwave test set 12 or 12' to drive the high power modulation amplifier and optical modulator. With the lightwave test set 10 incorporated into an HP 8510 vector network analyzer based system (and others having a separate source and receiver, including an HP 8753 economy vector network analyzer system and an HP 8757 scalar network analyzer system), the electrical source signal drives the modulation amplifier directly and is leveled through the modulator. A portion of this signal is fed to the reference of the HP 8510 vector network analyzer system test set, for example, an HP 8515 microwave test set, as shown in FIG. 2. The lightwave test set 10 operates nearly the same with other test sets, except the HP 8516 test set in doubled mode, with some change in sensitivity due to coupler loss differences.

Figure 3:
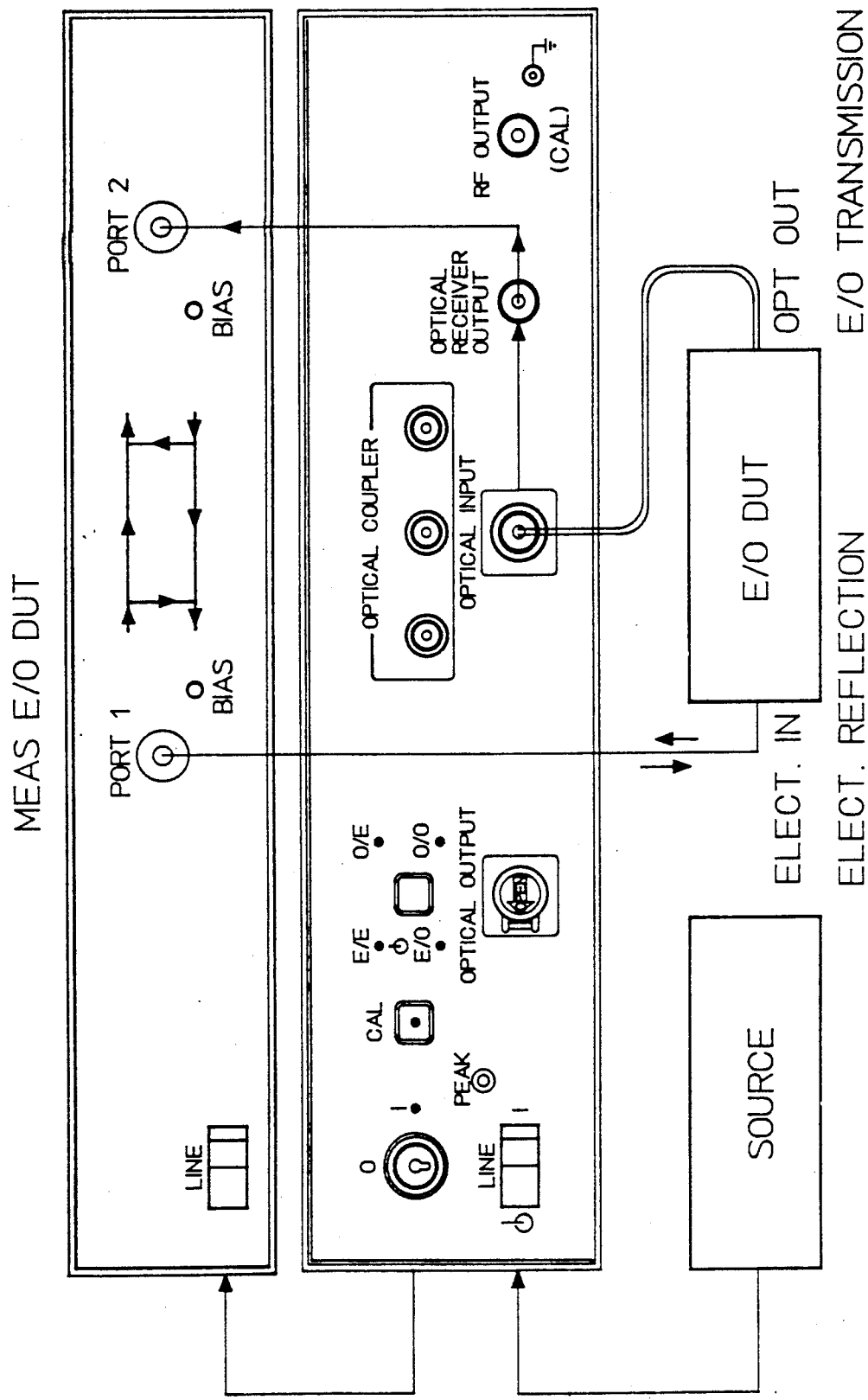
FIG. 3 is a plan view of the front panel of the lightwave test set and the front panel of an associated vector network analyzer test set for performing test measurements on electro-optical (E/O) devices for electrical reflection measurement using an RF drive signal obtained from the network analyzer.

Since the optical power is proportional to the leveled RF drive signal at its output and/or input, the power measured by the reference channel of the HP 8510 analyzer is representative of the optical output signal. An optical detected signal is sent to the HP 8510 PORT 2 receiver (from the DET OUT line), as shown in FIG. 3. In this way, the B/R ratio truly represents the ratio of received optical power over optical source power. In contrast, two measurements are needed in the lightwave component analyzer disclosed in the aforementioned Hernday, et al., application to produce this ratio, which will not ratio out real-time power level fluctuations.

As shown in FIG. 2, a switch S1 is added in the lightwave test set 10 to the input of the optical modulator, and another power splitter 34 is added to the output, to provide a high power RF drive signal available at the output. When measuring electro-optical (E/O) devices under test, such as laser diodes, the switch S1 bypasses the modulator (and its losses).

A second switch S2 is added in the lightwave test set 10 to provide a friendly standby condition, whereby the lightwave test set RF path is completely bypassed, and the HP 8510 vector network analyzer system operates as if no lightwave test set is present. This is the simplest and therefore preferred method for testing electrical (E/E) devices under test.

Performance of an RF network based lightwave analyzer testing system incorporating the lightwave test set 10 is similar to the performance of the lightwave component analyzer disclosed in the aforementioned Hernday, et al., application. However, there are compromises in accuracy, speed, and convenience associated with the external controller and additional cable connections of an RF network analyzer lightwave test set system.

To calibrate this system, a calibration measurement is performed, and combined with reference data, to obtain a correction factor which can be entered into the response calibration array of the RF network analyzer. The reference data is the response of the lightwave receiver, as measured at the factory.

The accuracy of this measurement, along with RF mismatch uncertainty and optical connector uncertainty, determines the accuracy of the RF network analyzer-lightwave test set system. Each measurement type electro-optical (E/O), opto-electrical (O/E), optical (O/O), and electrical (E/E) requires a different calibration measurement. This includes a different calibration for E/O high power, E/O reflection, O/E, and O/E with optical reflection.

What follows is a brief description of the several lightwave measurements, with a complete cabling diagram showing the front panel of the lightwave test set 10. Also described are the appropriate calibration measurement with the responses forming the measurement listed and a user measurement of a device under test (DUT) showing connections, responses contributing to the measurement, and the correction factor to be used to yield the desired DUT measurement.

Figure 6:
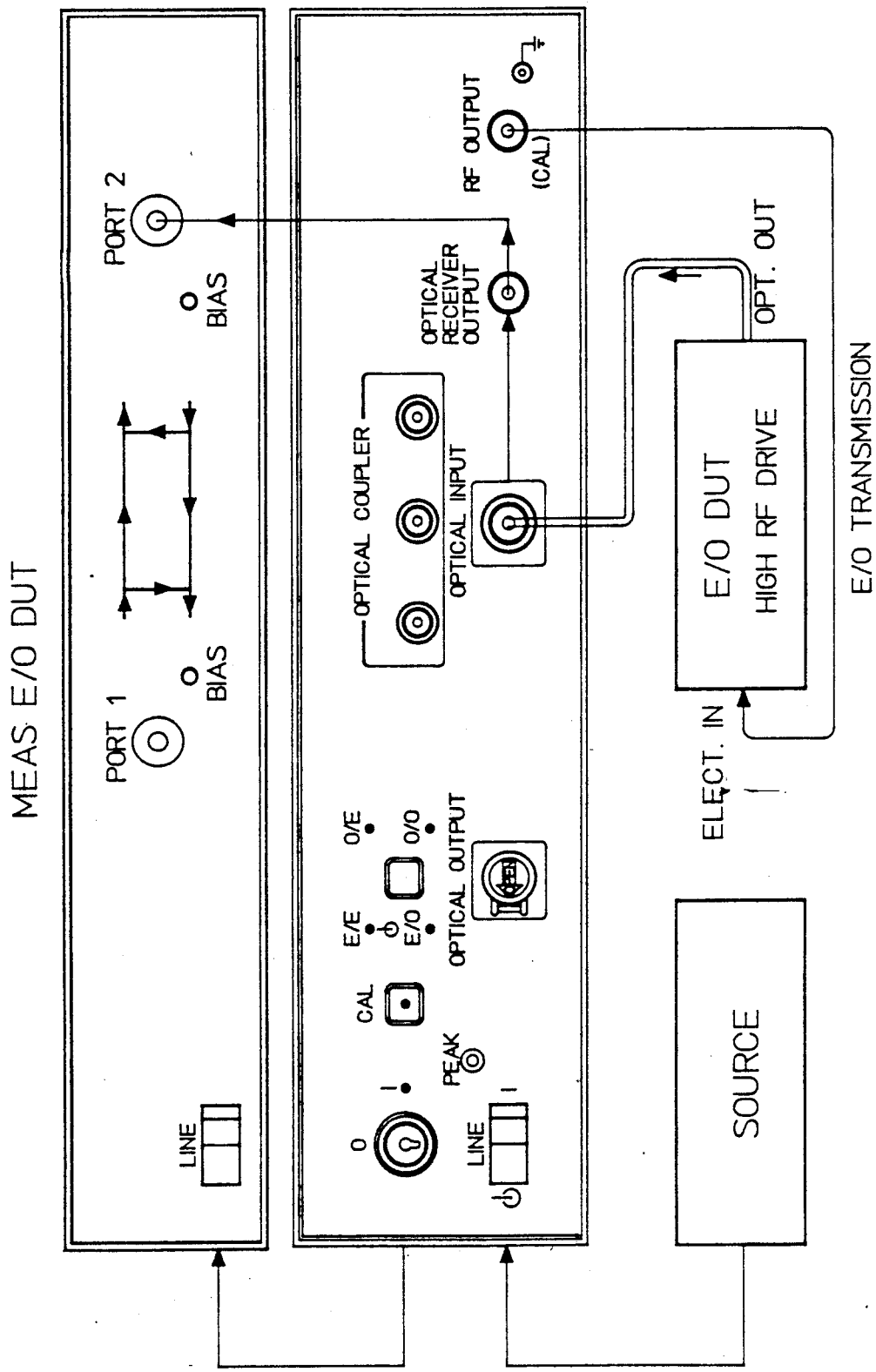
FIG. 6 is a plan view of the front panel of the lightwave test set and the front panel of an associated vector network analyzer test set for performing test measurements on electro-optical (E/O) devices using an RF drive signal obtained from the lightwave test set.

There are two possibilities for E/O measurements, depending upon the RF drive chosen for the E/O DUT. The two drives available are the RF drive from the HP 8515 test set PORT 1, and the high power RF drive from the lightwave test set 10, as shown in FIGS. 3 and 6, respectively. The first allows simultaneous measurement of RF input return loss and E/O transmission, and the second provides a much higher RF drive to the E/O DUT.

Figure 5:
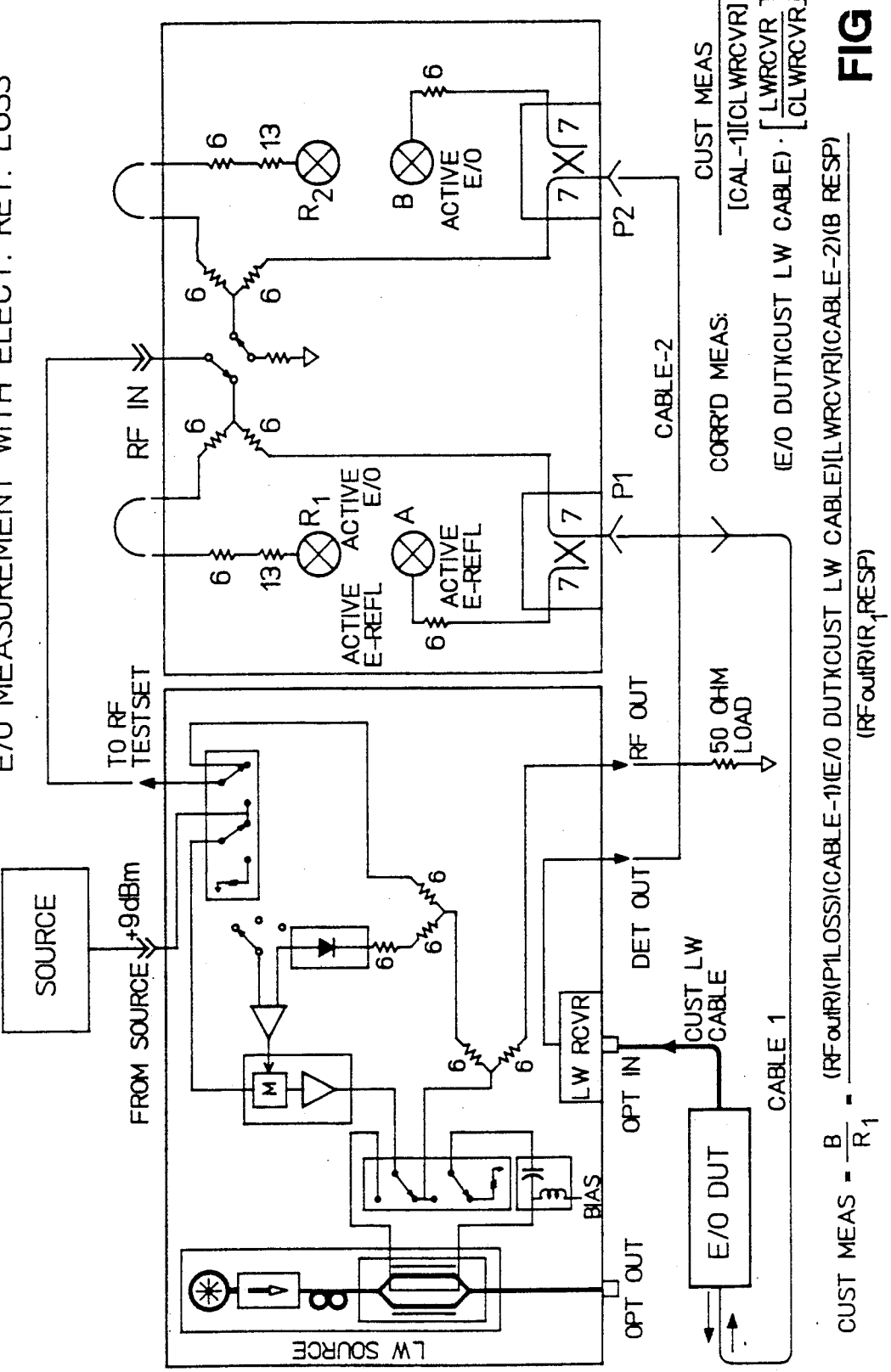
FIG. 5 is a block diagram of the E/O test measurement shown in FIG. 3.

As shown in FIGS. 3 and 5, RF drive can be obtained from the HP 8515 microwave test set PORT 1 for electrical reflection and E/O transmission measurements on an E/O DUT. The optical receiver is connected to the HP 8515 microwave test set PORT 2, and the measurement of the DUT is as shown in FIG. 5.

Figure 4:
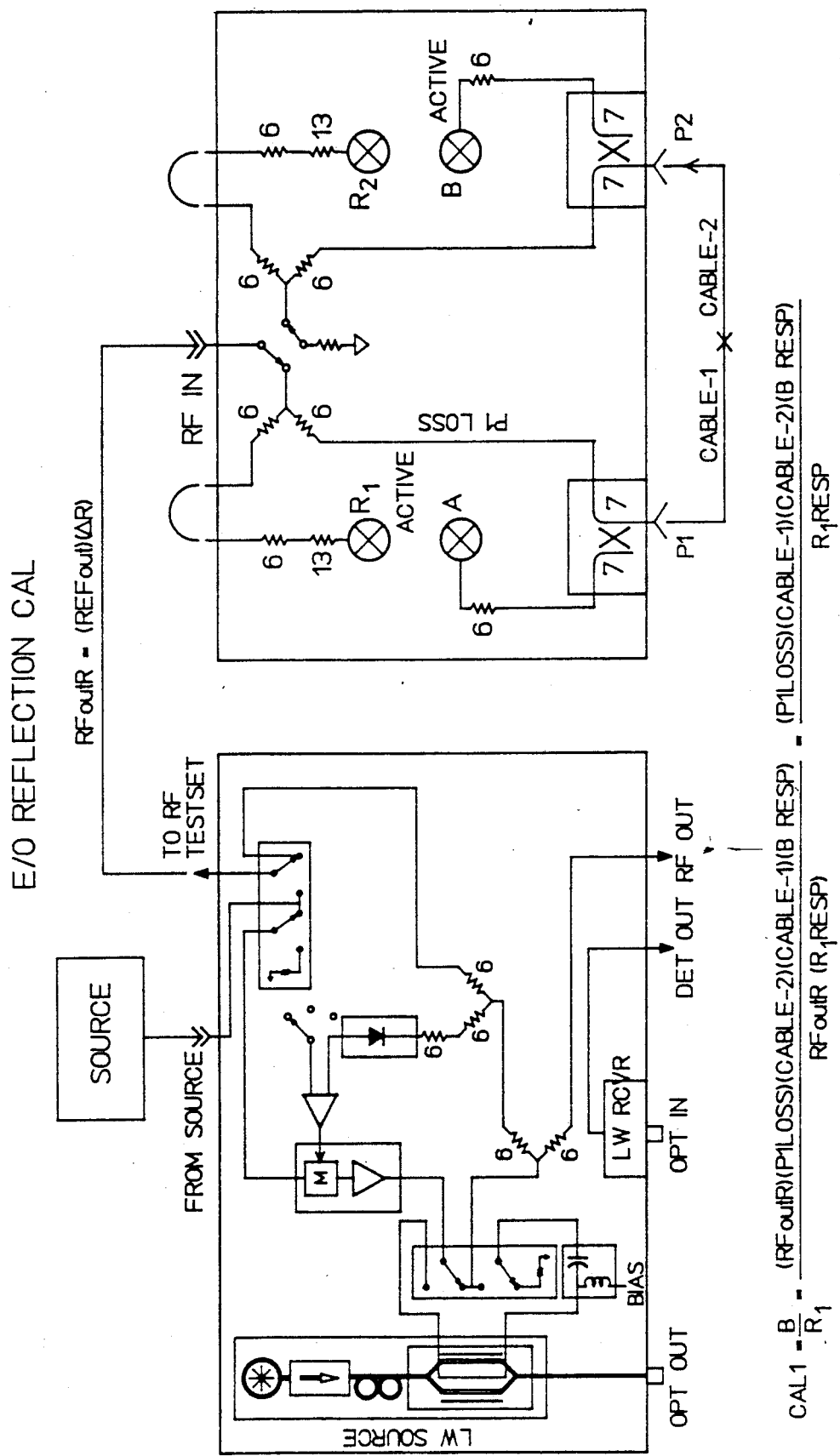
FIG. 4 is a block diagram for calibration of the E/O test measurement shown in FIG. 3.

As shown in FIG. 4, calibration comprises measuring the RF response of the system from PORT 1, through cable-1 and cable-2, to PORT 2. This response is combined with the lightwave receiver response (CLWRCVR) to obtain a correction factor.

It is possible to remove the effects of the patch cable, but this adds two optical connection uncertainties, and the increase in accuracy may not be justified. However, the ability to calibrate out the optical cable can be incorporated into the software.

For the measurement of the E/O DUT, the lightwave receiver is connected to PORT 2 using cable-2. The RF source from PORT 1, through cable-1, is connected to the E/O DUT input.

If RF return loss is desired, a one-port calibration at the end of cable-1 can be performed first. The maximum RF drive available is approximately −10 dBm. The optical output of the E/O DUT is connected to the lightwave receiver. If a patch cable is needed, it becomes part of the E/O DUT measurement (it is not calibrated out). In other words, the optical connector of the lightwave receiver is the calibrated optical input.

The error-corrected measurement of the E/O DUT comprises dividing the DUT response by the product of the calibration measurement and the constant for the lightwave receiver (referred to as CLWRCVR). The corrected measurement has a long term stability limited by the stability of the lightwave receiver response; that is, the tracking between the lightwave receiver and the factory measurement of its response is the only term that cannot be corrected during a measurement of the E/O DUT.

If control of the RF drive level is desired, the lightwave test set 10 can be placed in standby mode, bypassing the internal leveling loop and allowing the RF source power to set the power available at the test port. The calibration technique is unchanged.

The following summarizes the calibration and test measurements on an E/O DUT when RF drive is obtained from the HP 8515 microwave test set PORT 1.

Calibration measurement:
Cal1 = B/R1 = (P1loss)(cable-1)(cable-2)(Bresp)/(R1resp)

Measurement of the DUT:

$$B/R1 = \frac{(P1loss)(cable-1)\{E/ODUT\}(LWcable)[LWRCVR](cable-2))(Bresp)}{(R1Resp)}$$

Correction = 1/[Cal1][CLWRCVR]

Corrected Measurement =

$$\{E/O\ DUT\}(LWcable) \cdot \frac{[LWRCVR]}{[CLWRCVR]}$$

Figure 8:
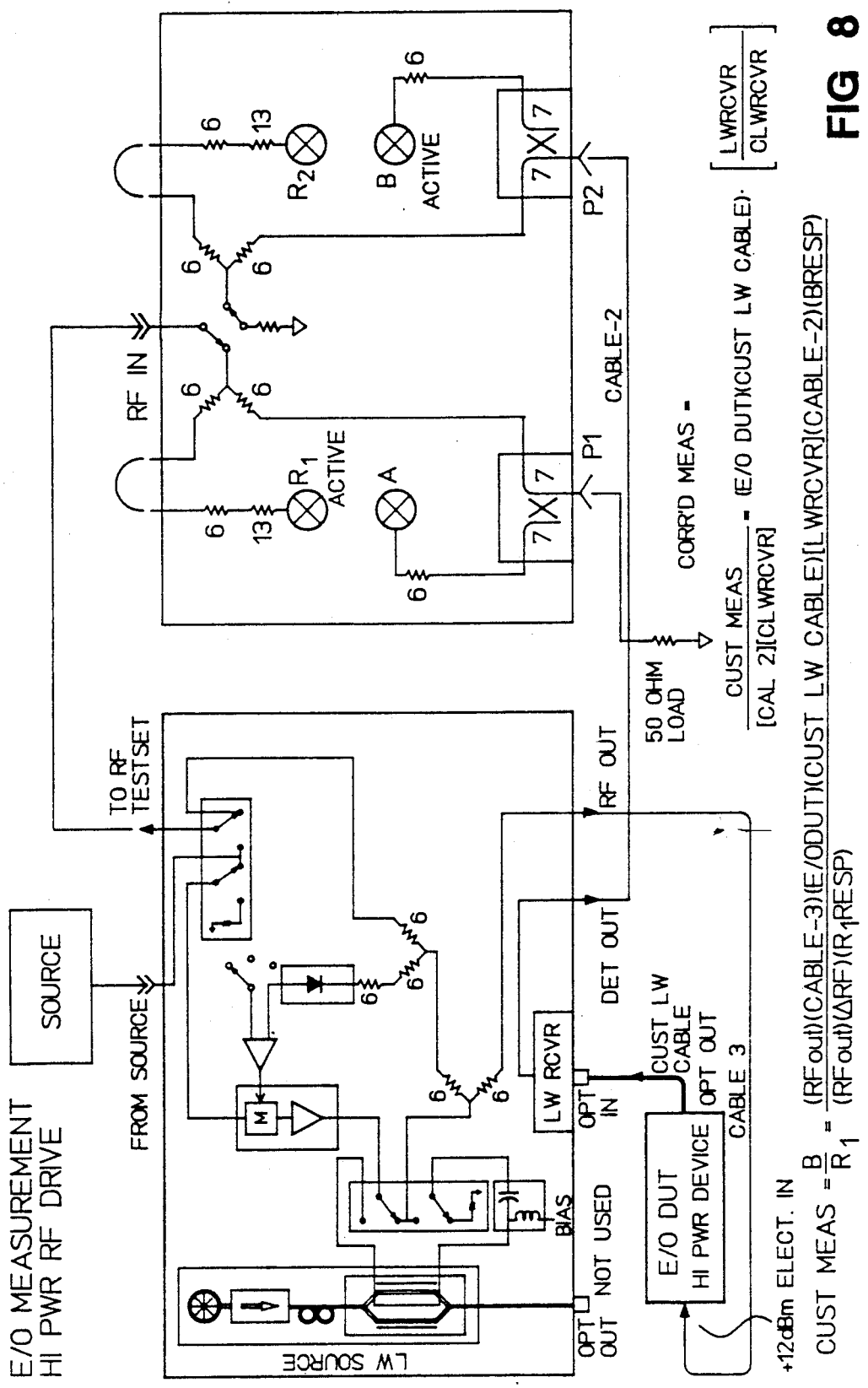
FIG. 8 is a block diagram of the E/O test measurement shown in FIG. 6.

As shown in FIGS. 6 and 8, RF drive can alternatively be obtained directly from the lightwave test set 10 for electrical reflection and E/O transmission measurement on an E/O DUT. The RF output port of the lightwave test set 10 has been added to take advantage of the high power RF amplifier needed to drive the optical modulator. When electrical stimulus is selected on the front panel of the lightwave test set 10, the optical modulator is bypassed, and the high power RF output from the amplifier is available through a power splitter to the front panel RF DRIVE connector. This drive level is approximately +12 dBm over the source frequency range and is preferably internally leveled. This high power RF drive is particularly needed for driving laser diodes.

A lower power calibration signal (approximately 0 dBm) is available by selecting the CAL button near the RF DRIVE connector. It is necessary to reduce the output power to 0 dBm during E/O calibration to avoid driving the HP 8515 B microwave test set channel into compression. (The "Cal" state is disabled during optical stimulus measurements.) Accordingly, three set power levels are provided to drive E/O devices under test: 0 dBm and +12 dBm from the RF DRIVE output and −15 dBm from PORT 1 of the HP 8515 microwave test set.

Figure 7:
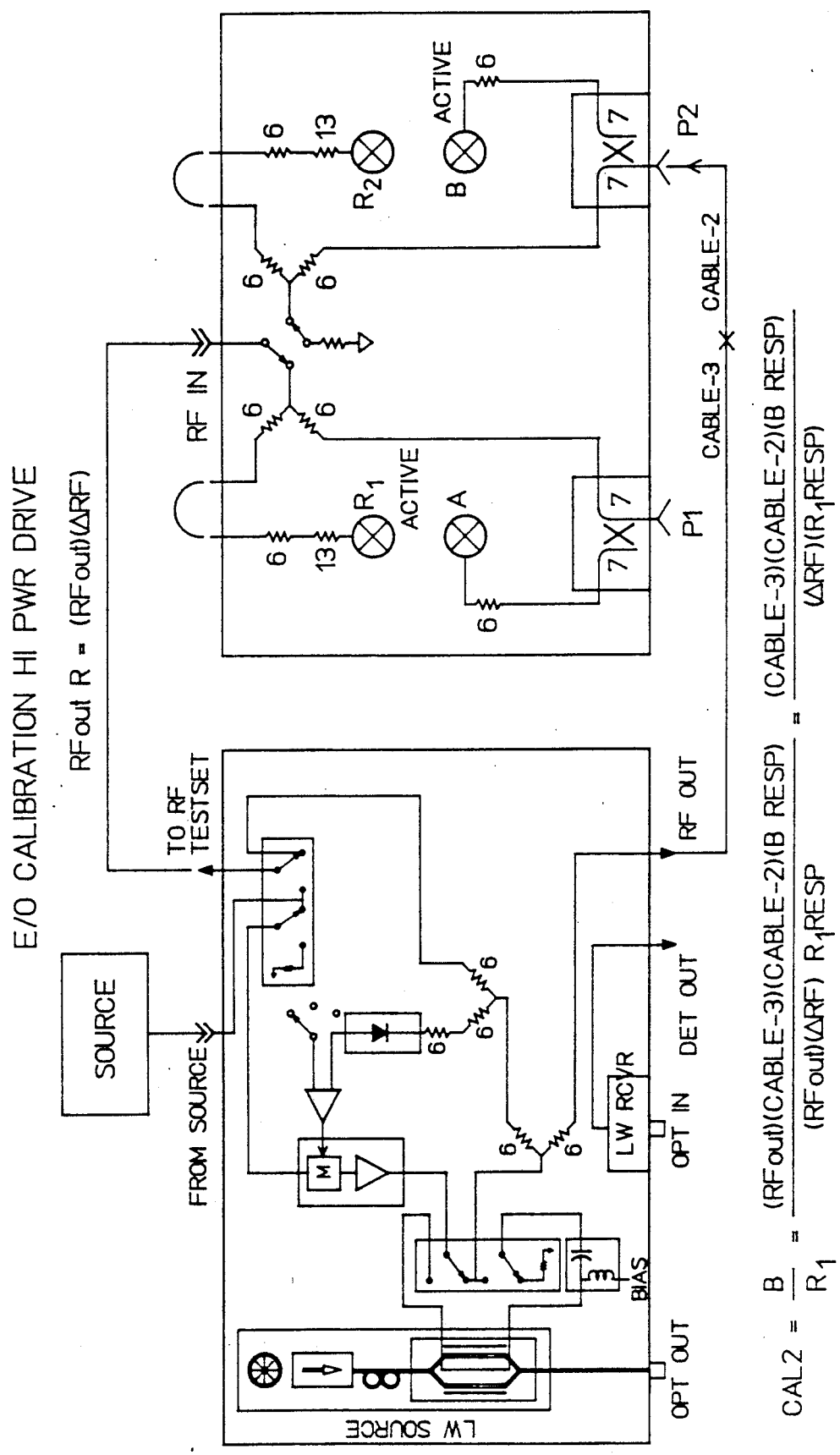
FIG. 7 is a block diagram for calibration of the E/O test measurement shown in FIG. 6.

As shown in FIG. 7, the calibration is the same type as when the RF drive signal is obtained from the HP 8515 microwave test set PORT 1, here using cable-3 from the RF OUT connector.

The calibration equations are similar, and the final result is the same. The calibration measurement (Cal2) accounts for the RF cables, but not for the lightwave cable, as in the previously described calibration.

The correction factor is 1/[Cal2][CLWRCVR], and the corrected measurement becomes:

Corrected Measurement =

$$\{E/O\ DUT\}(LWcable) \cdot \frac{[LWRCVR]}{[CLWRCVR]}$$

with the same uncertainties as the previously described calibration.

Figure 9:
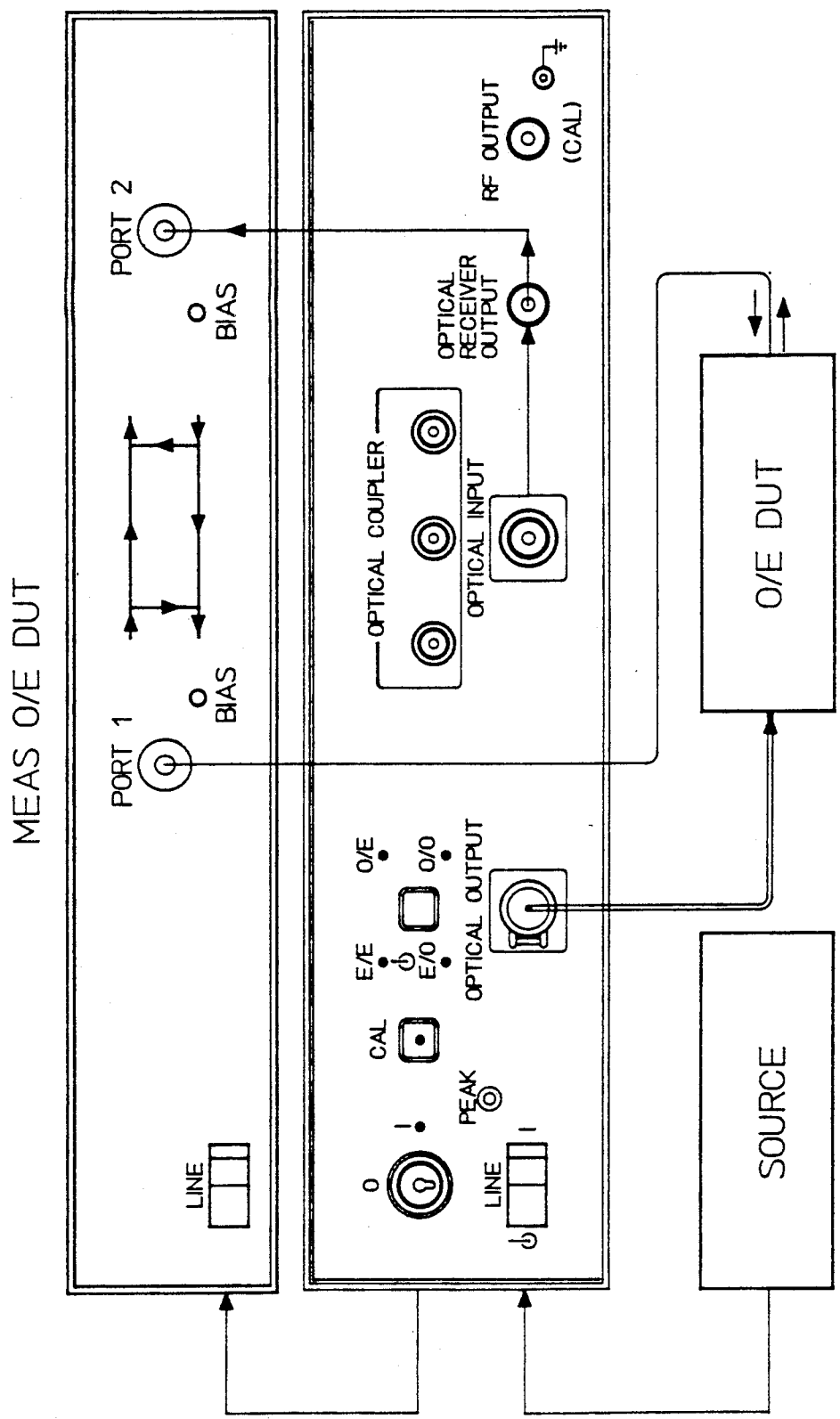
FIG. 9 is a plan view of the front panel of the lightwave test set and the front panel of an associated vector network analyzer test set for performing test measurements on opto-electrical (O/E) devices.
Figure 11:
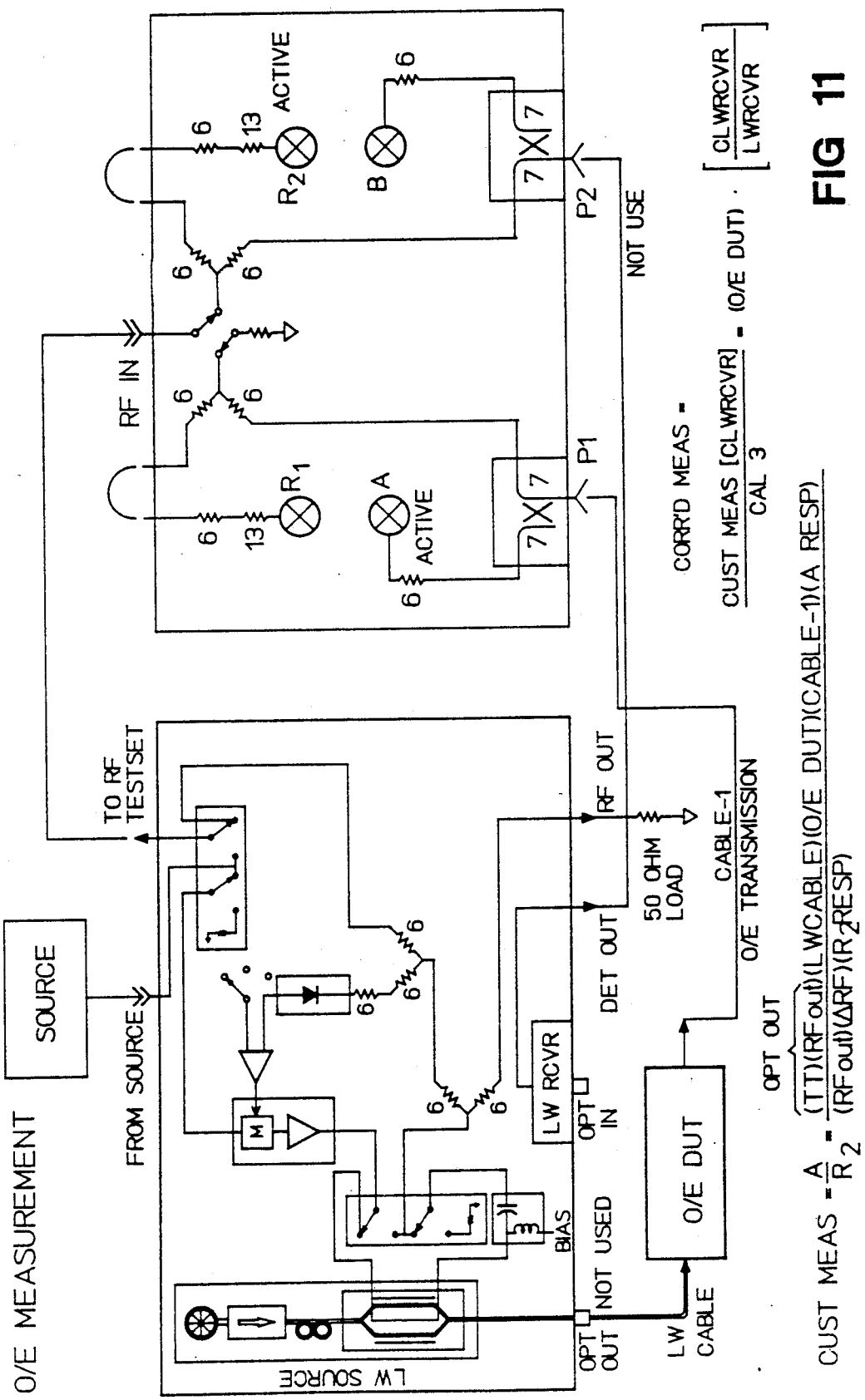
FIG. 11 is a block diagram of the O/E test measurement shown in FIG. 9.

As shown in FIGS. 9 and 11, O/E measurements are performed by utilizing the RF modulated lightwave source as a stimulus and measuring the electrical response by means of the HP 8515 microwave test set. The modulating RF signal from the RF source (e.g., an HP 8340 synthesized sweeper) is amplified and internally leveled to provide the maximum optical modulated power from the lightwave source. This modulated RF level is preferably not user-controlled, but is set at the factory.

The electrical signal from the O/E DUT is sampled through the PORT 1 input of the HP 8515 microwave test set. The PORT 2 input can be used, but if a calibration of all the paths (E/O, O/E, and O/O) has been performed, PORT 2 is used to sample the optical receiver RF output.

Figure 10:
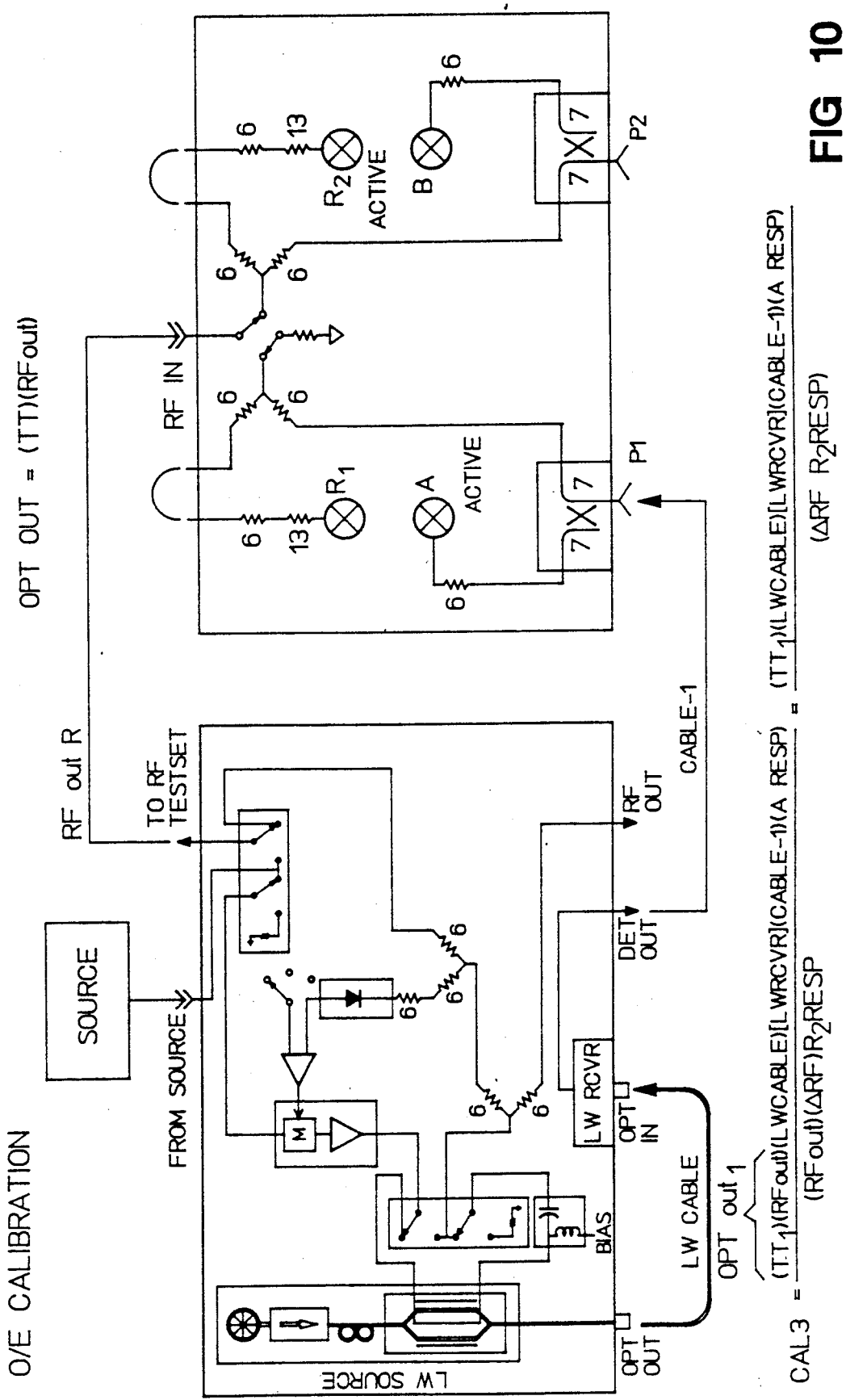
FIG. 10 is a block diagram for calibration of the O/E test measurement shown in FIG. 9.

To calibrate the O/E measurement, as shown in FIG. 10, the internal optical receiver is measured, and the total system response is recorded as Cal3. This is performed by connecting a lightwave optical test cable from the lightwave source to the lightwave receiver. An RF cable (cable-1) is connected from the optical receiver RF output to PORT 1.

After the calibration measurement is performed, the end of the lightwave cable becomes the source for the optical stimulus, and the end of the RF cable (cable-1) is the input port for the electrical response. In this measurement, PORT 2 is the active signal port, that is, the HP 8515 microwave test set is set in the reverse parameter direction. If it is desired to measure the RF output match of the O/E DUT, the HP 8515 microwave test set can be set to the forward direction, and a one-port calibration can be performed at the end of cable-1.

As shown in FIG. 11, the measurement of the O/E DUT is performed by placing the DUT between the optical lightwave cable (source) and RF cable-1 (receiver). A measurement of the O/E DUT can be performed and error-corrected by multiplying by the factory measurement of the lightwave receiver and dividing by the Cal3 measurement.

In these measurements, the optical RF and optical test cables are removed by the calibration. In this way, the end of each cable is effectively the test port.

The following summarizes the calibration and test measurements on an O/E DUT.

Cal3 = (TT)(LWcable)[LWRCVR](cable-1)(Aresp) / (f)(R2resp)

Measurement of the DUT:
$$A/R2 = \frac{(TT)(LWcable)\{O/E\ DUT\}(cable-1)(Aresp)}{(f)(R2resp)}$$

Correction = [CLWRCVR]/[Cal3]

$$\text{Corrected Measurement} = \{O/E\ DUT\} \cdot \frac{[CLWRCVR]}{[LWRCVR]}$$

Here again, the only factor which is not calibrated out is the difference between the lightwave receiver response and the factory measurement of the lightwave receiver (CLWRCVR).

The connection from the optical receiver RF output to the HP 8515 microwave test set PORT 2 can be left in place during O/E measurements. This is convenient if a complete calibration of all measurements has previously been performed at one time.

Figure 12:
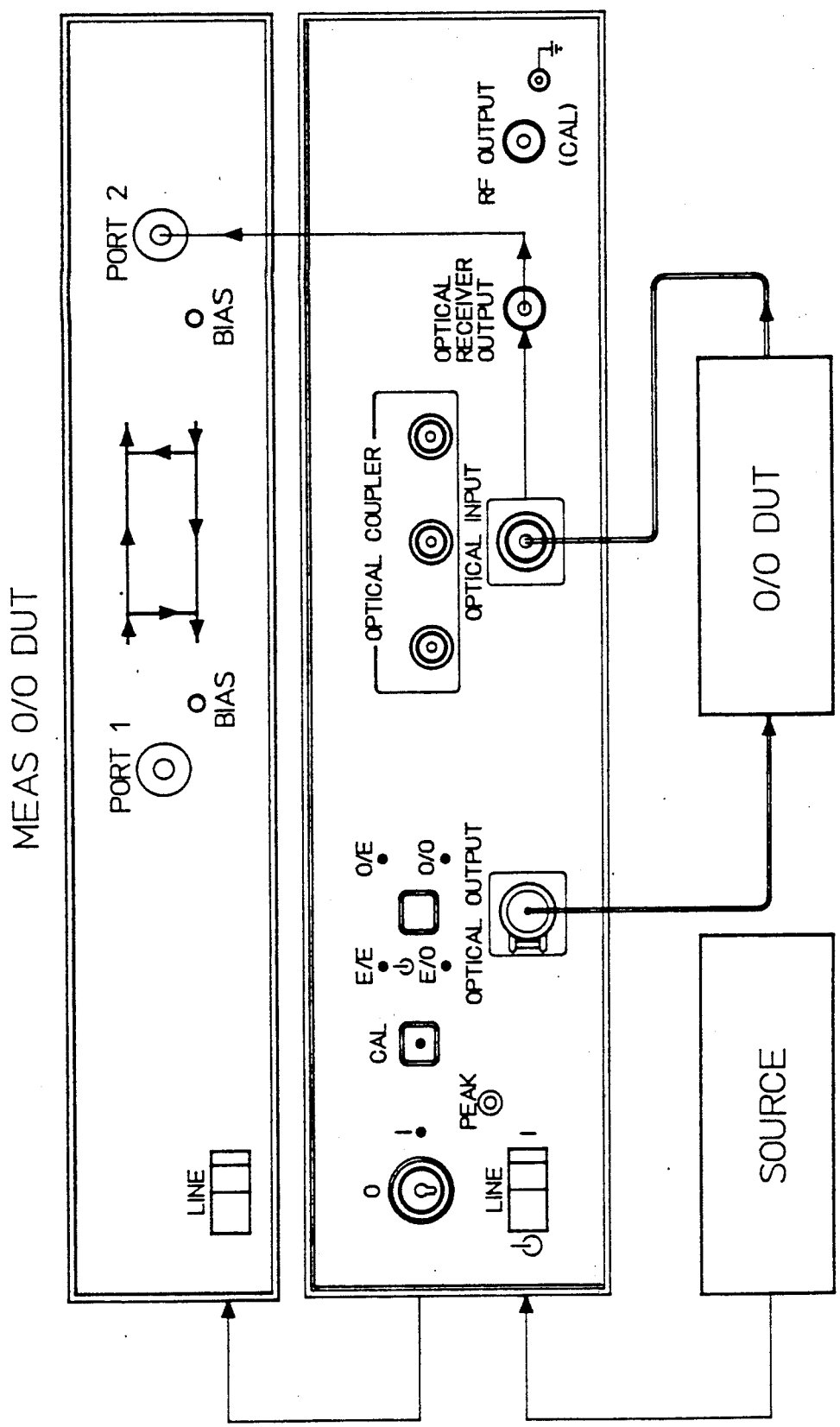
FIG. 12 is a plan view of the front panel of the lightwave test set and the front panel of an associated vector network analyzer test set for performing test measurements on optical (O/O) devices.
Figure 13:
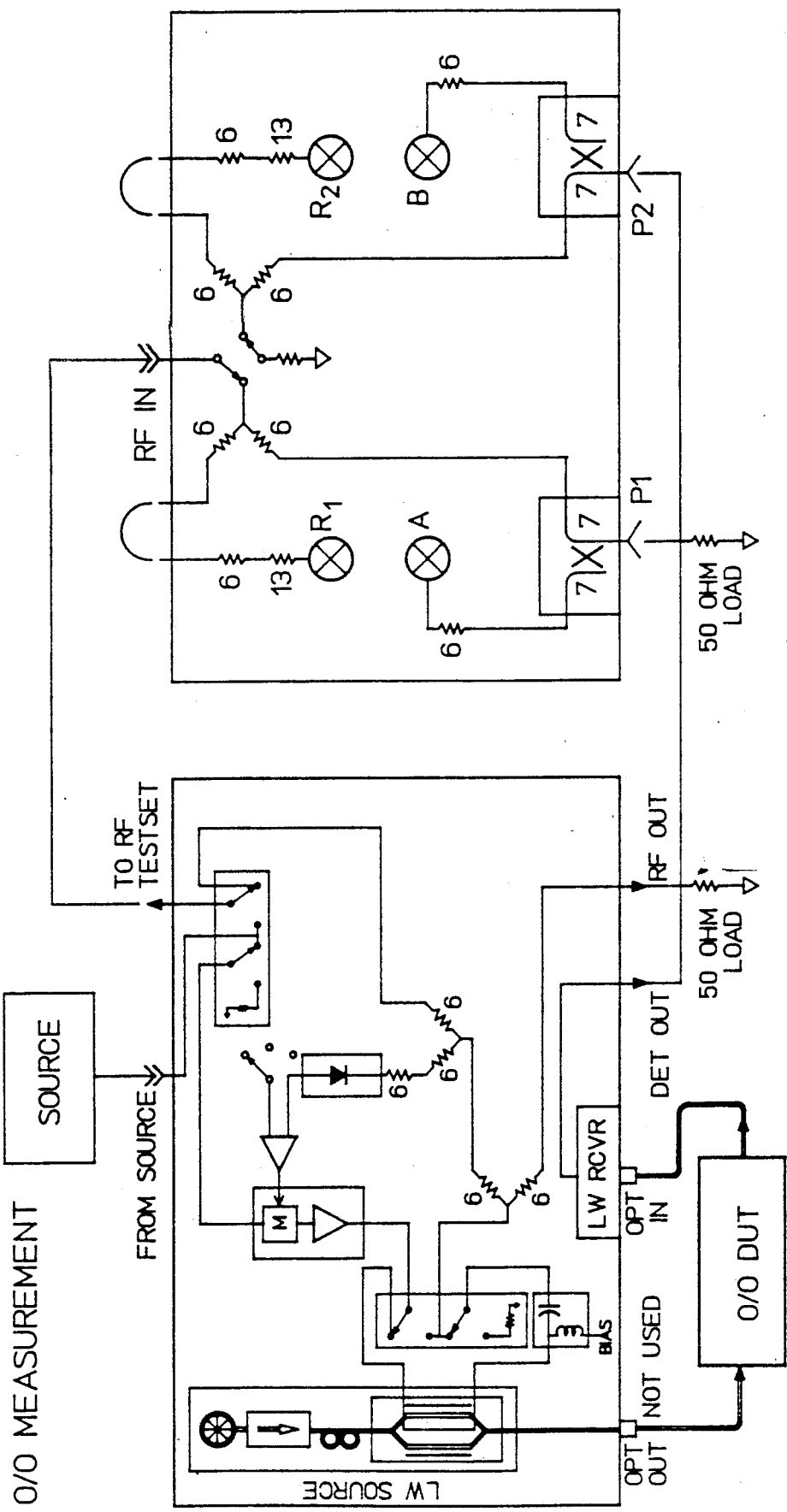
FIG. 13 is a block diagram of the O/O test measurement shown in FIG. 12.

As shown in FIGS. 12 and 13, an O/O measurement utilizes both the lightwave source and lightwave receiver in the lightwave test set 10. The measurement is an insertion loss or return loss measurement (only one at a time).

Calibration is performed by normalizing the response using standard RF normalization routines (data-divided-memory or response correction). A through normalization is performed by connecting the source to the receiver. A measurement of the O/O DUT is performed by inserting the DUT and displaying the difference between this measurement and the calibration measurement. As these calibrations are common response calibrations, the calibration diagram for O/O measurements is not shown.

Figure 14:
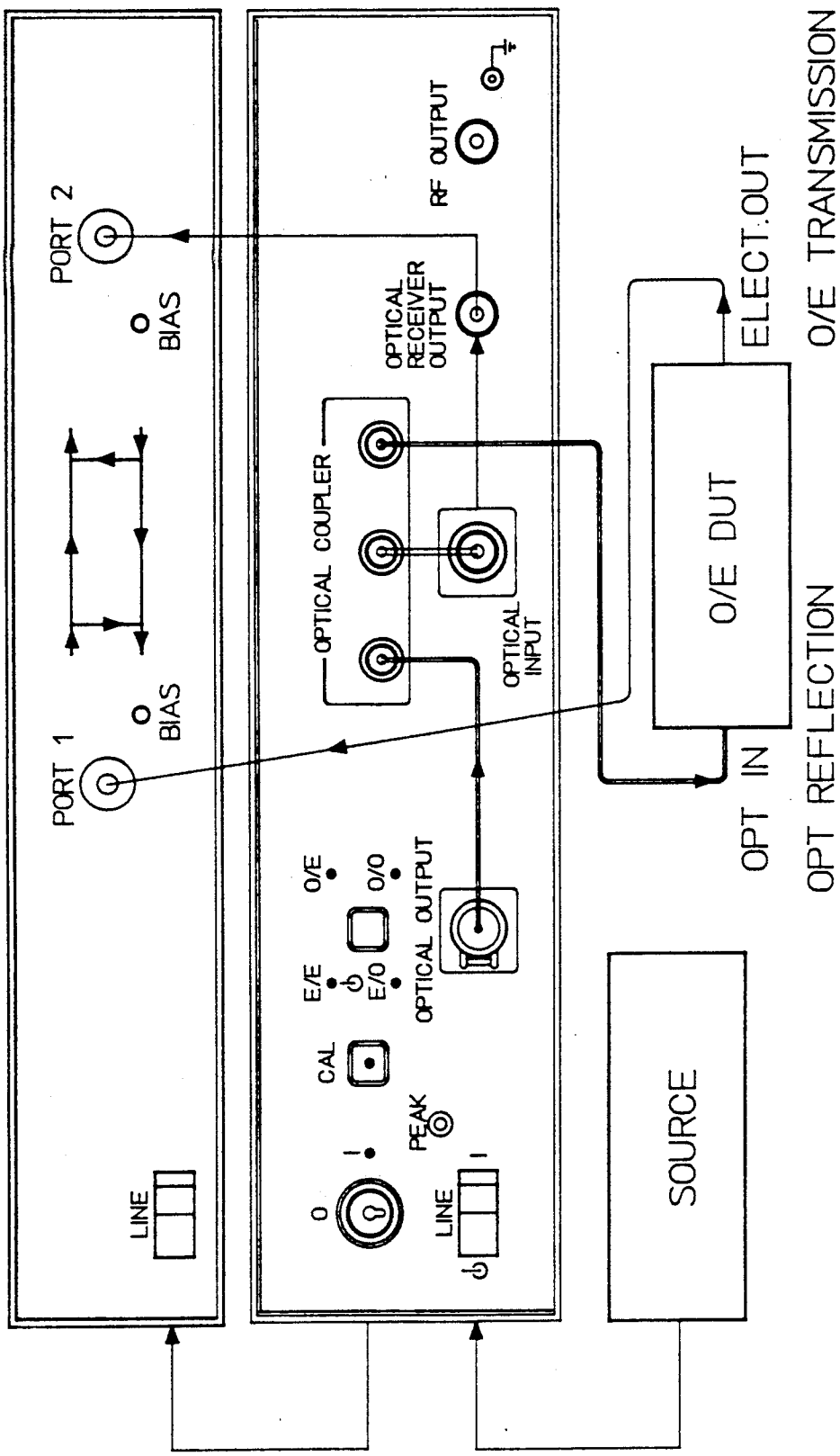
FIG. 14 is a plan view of the front panel of the lightwave test set and the front panel of an associated vector network analyzer test set for performing test measurements on optical reflection and opto-electrical (O/E) transmission devices.
Figure 15:
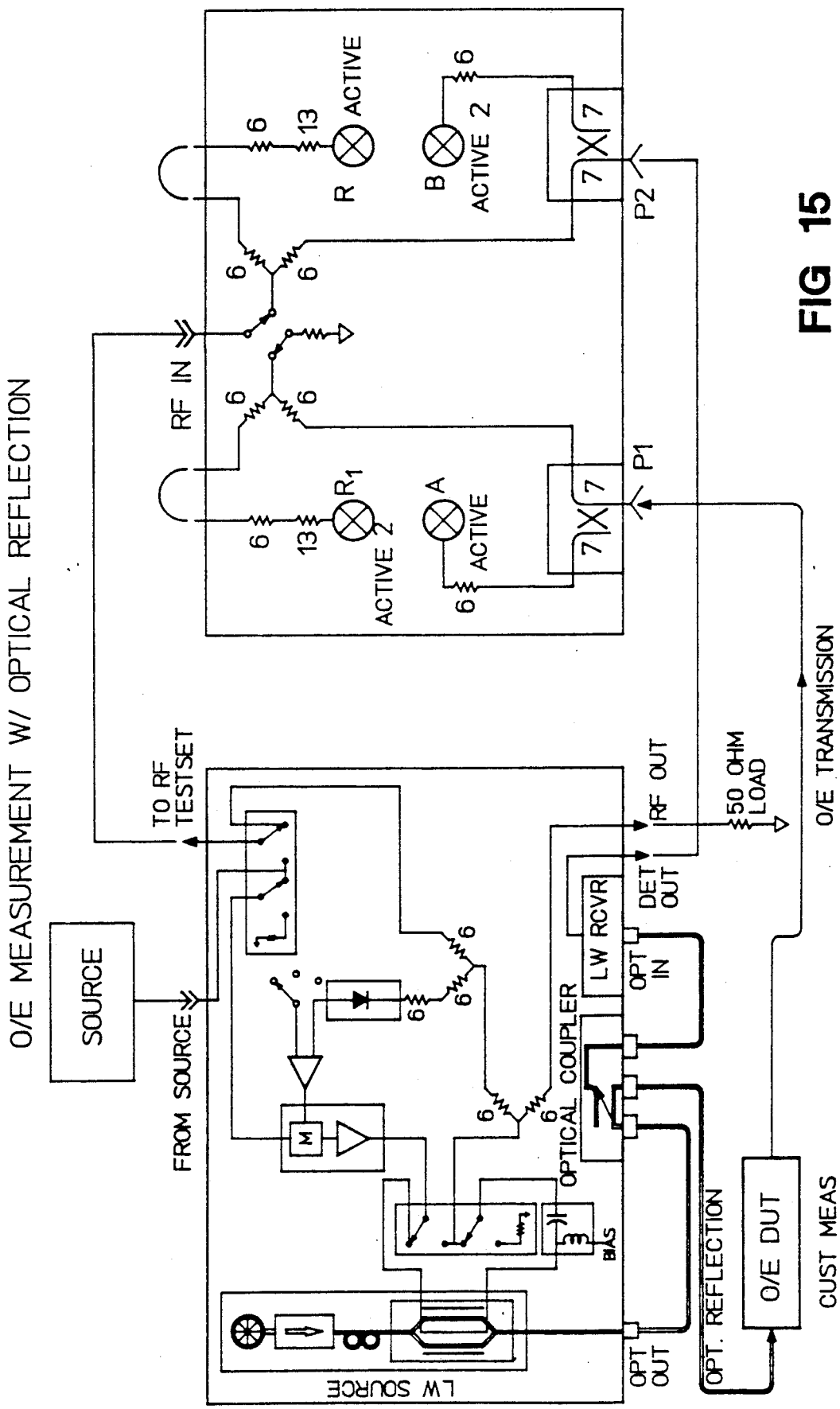
FIG. 15 is a block diagram of the optical reflection and opto-electrical (O/E) transmission test measurement shown in FIG. 14.

For optical reflection measurements, the calibration is similar, but this time an open connector is used, instead of a "through," and the normalized response represents a Fresnel reflection of 3.5% (−14.56 dB optical return loss). A test set up for optical reflection is shown in FIGS. 14 and 15.

Figure 16:
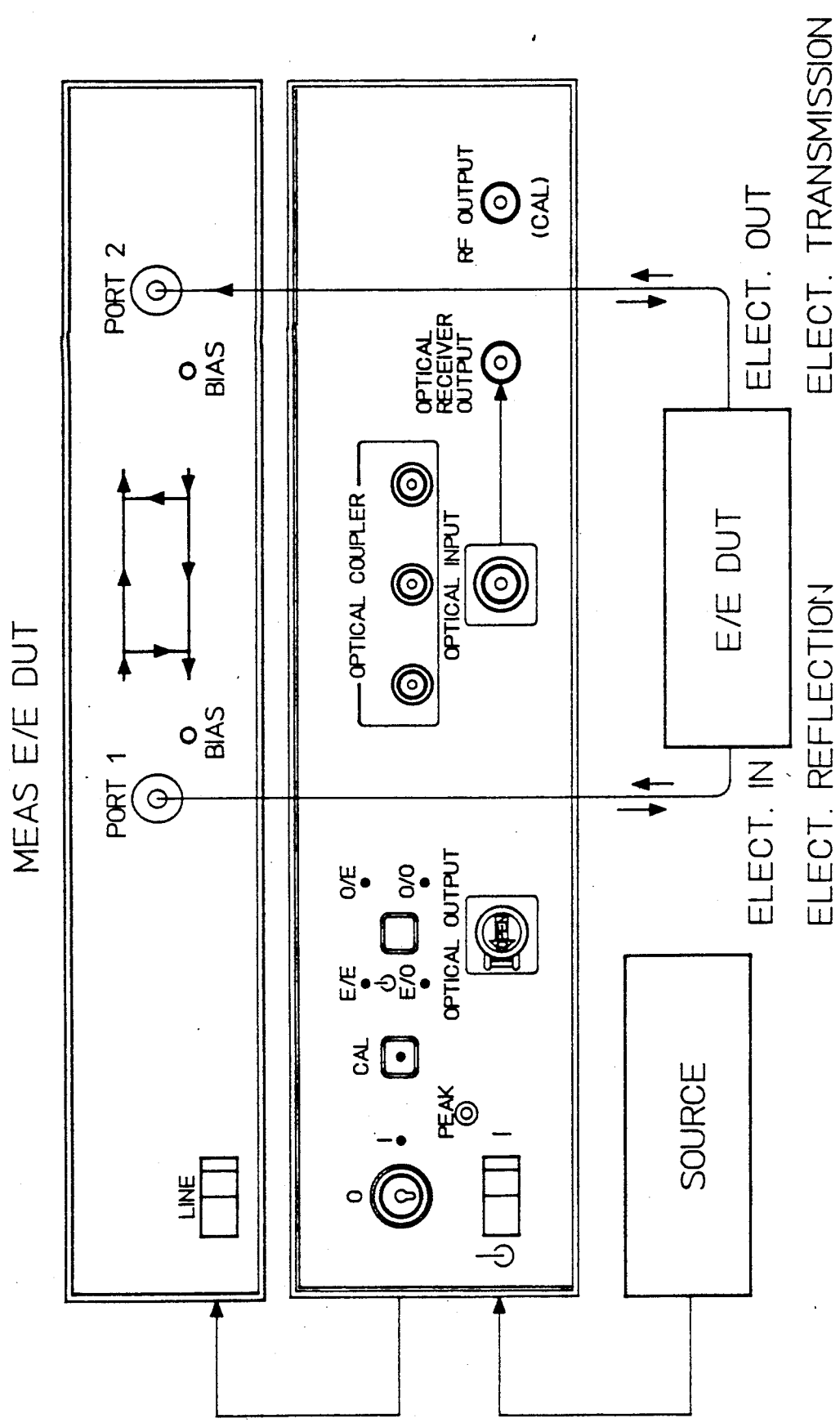
FIG. 16 is a plan view of the front panel of the lightwave test set and the front panel of an associated vector network analyzer test set for performing test measurements on electrical (E/E) devices.
Figure 17:
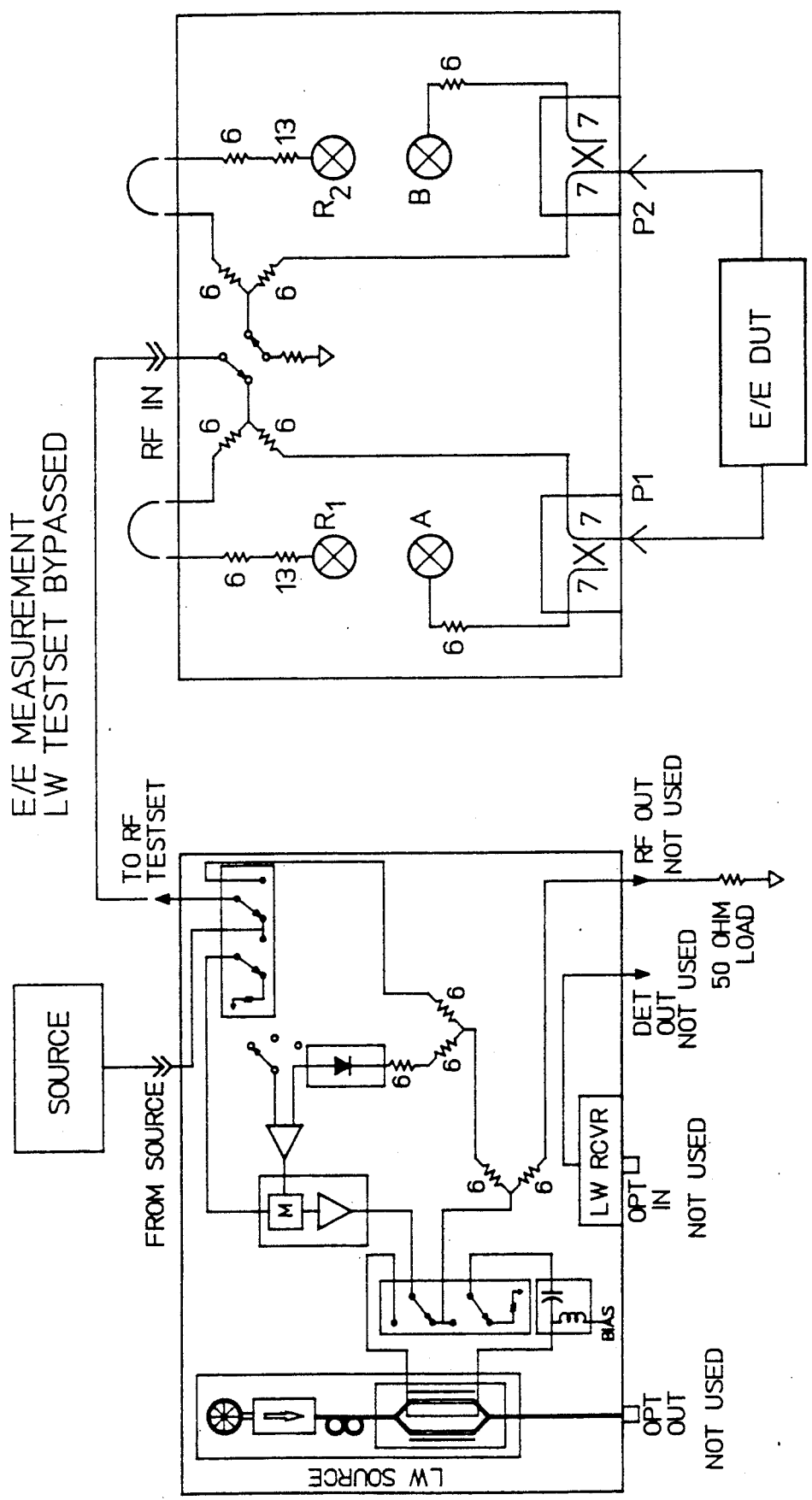
FIG. 17 is a block diagram of the electrical (E/E) test measurement shown in FIG. 16.
Figure 18:
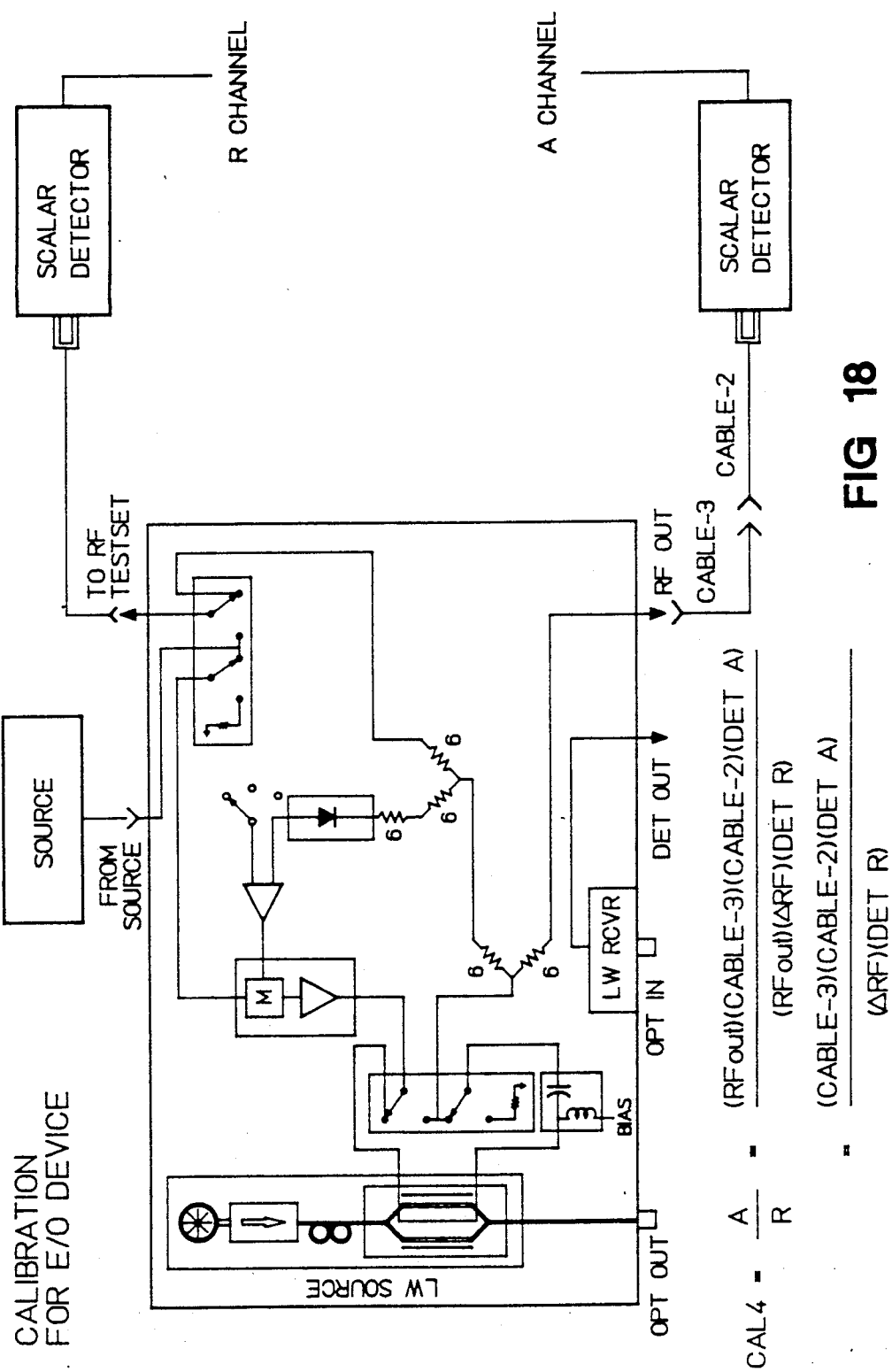
FIGS. 18-22 show calibration and test measurement block diagrams for E/O, O/E, and O/O devices utilizing a scalar network analyzer.
Figure 19:
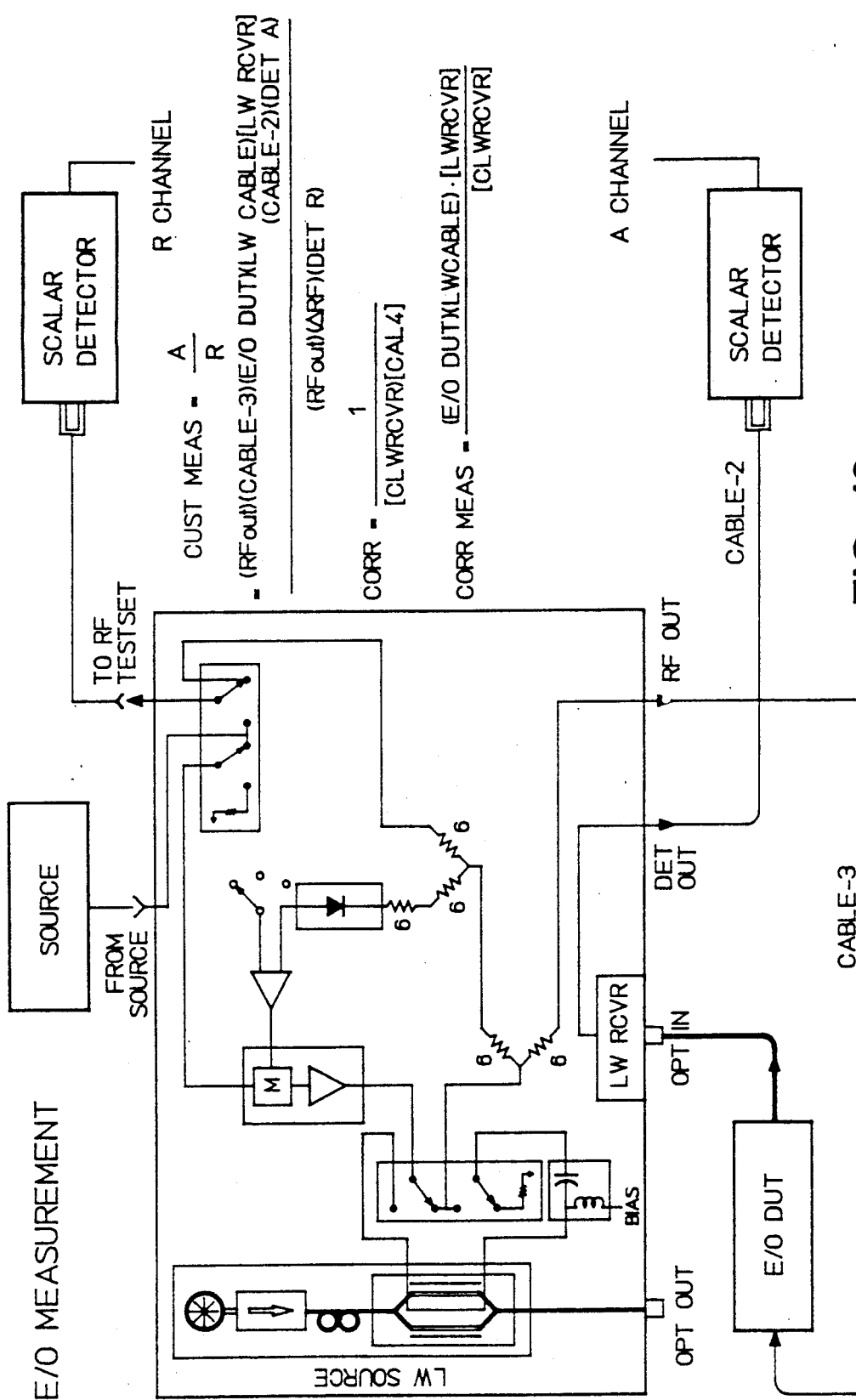
Figure 20:
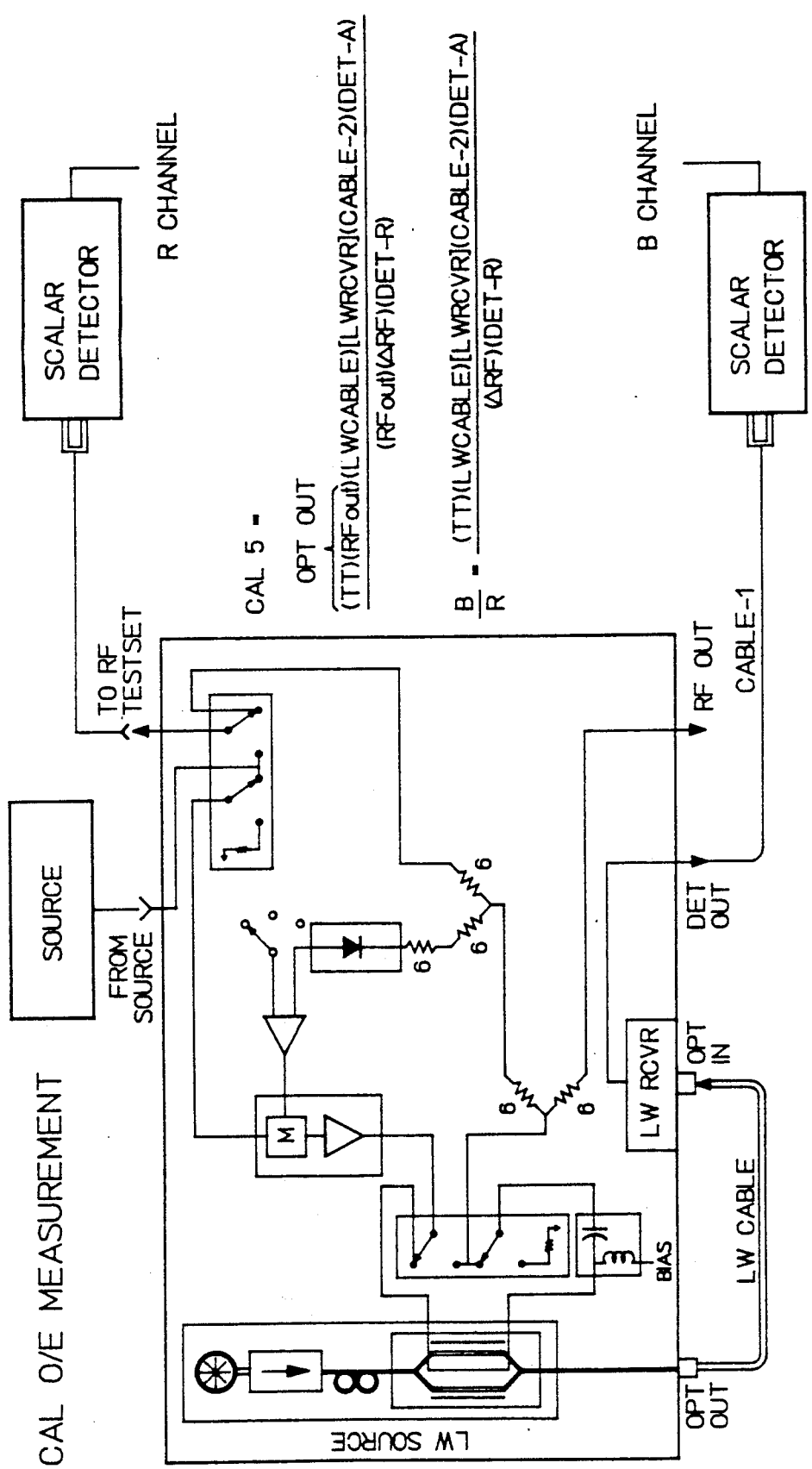
Figure 21:
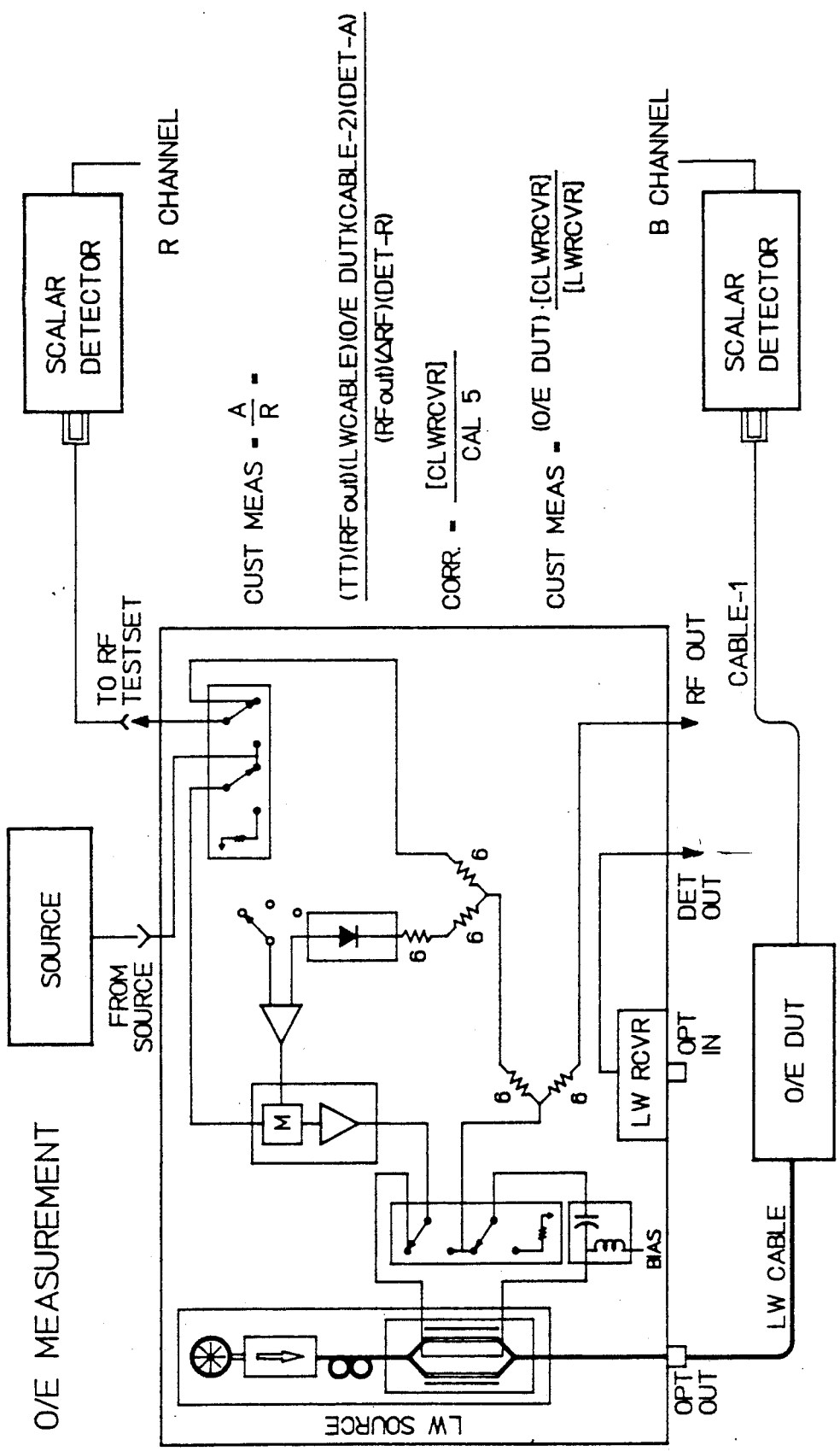
Figure 22:
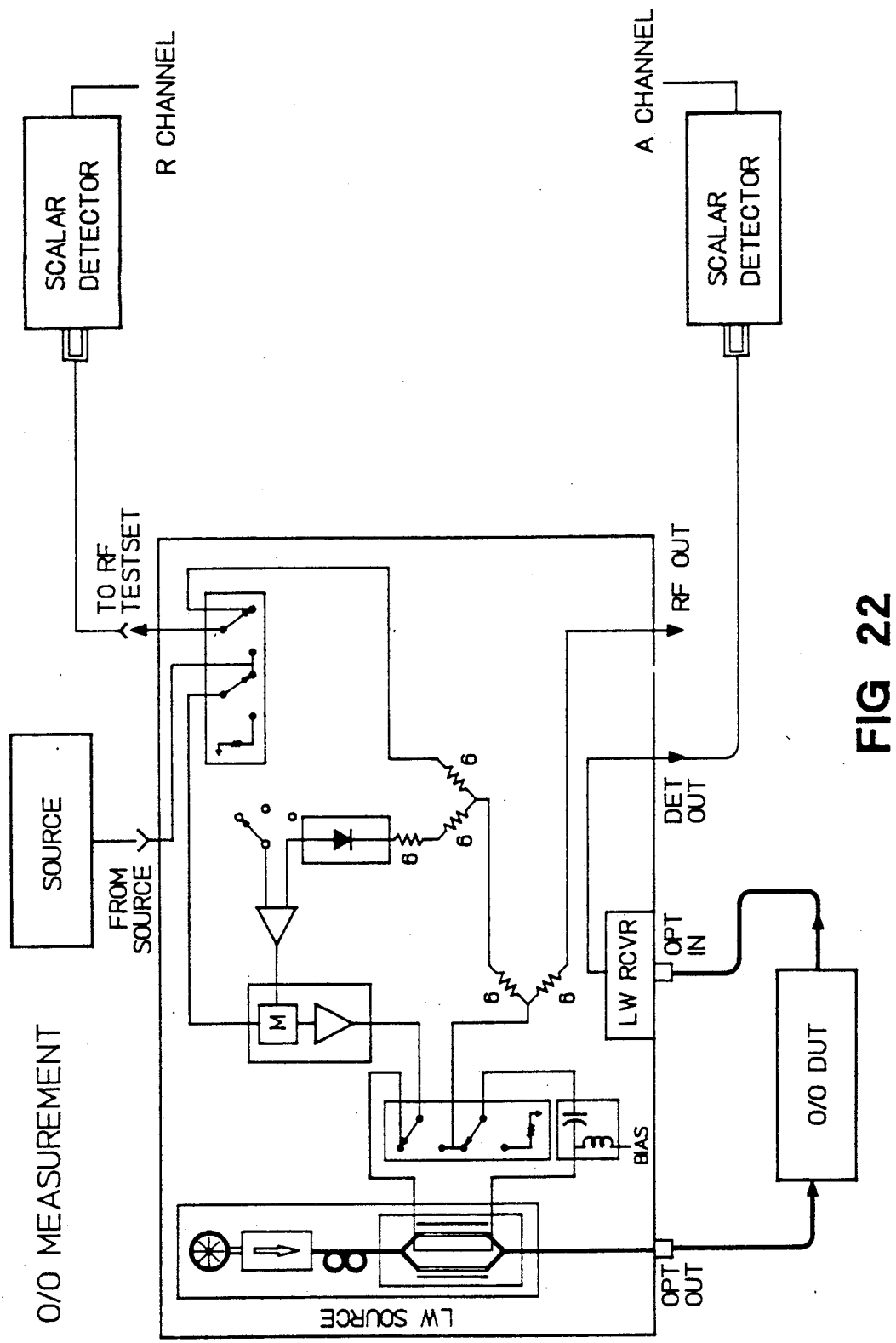

E/E measurements are the standard operating mode of the HP 8510 vector network analyzer system. As shown in FIGS. 16 and 17, the preferred way to perform these measurements is to switch the lightwave test set 10 to standby, which bypasses its internal RF components, and utilize the HP 8510 vector network analyzer system in its typical system configuration. No calibration information for E/E measurements is presented here.

The HP 8757 scalar network analyzer system and any compatible source can also be utilized as an RF network analyzer with the lightwave test set 10. The HP 8757 detector will limit optical dynamic range. The configurations for the three key measurements (E/O, O/E, and O/O) are shown in block diagram form in FIGS. 18-22, along with the appropriate user calibration set up.

The calibrations and correction factors are essentially the same in the scalar network analyzer system configuration as in the HP 8510 vector network analyzer system. Here, scalar detectors replace the HP 8515 microwave test set samplers, but the calibration routines are the same. By calibrating the channel B detector first, and utilizing it for O/E devices, then calibrating the channel A detector, and utilizing it for E/O and O/O devices, all three key measurements can be performed without additional setups or calibrations.

The software for the instrument controller for the lightwave test set 10 is intended to add capabilities to the lightwave testing system. The primary addition is providing for calibrated E/O and O/E responsivity measurements and optical return loss calibration (Fresnel). Preferably, the software enhances the ease of use of calibrating the various measurement configurations.

The software properly sets up the microwave receiver for the measurement selected. It reads lightwave receiver calibration data from a disk and interpolates it to match the current measurement points. The software also combines the lightwave receiver calibration with the user calibration to form a complete calibration. Finally, the software writes this calibration set to the instrument memory.

Preferably, the software provides a simple interface for lightwave test setup. It also preferably provides some instruction in setup and calibration, provides the ability to save instrument setups and calibrations, and enhances the presentation of measurements with text.

The software does not configure and control network analyzer functions. Similarly, it does not provide sophisticated data processing or graphics.

When utilized with the HP 8510 vector network analyzer system in optical mode, a change to the HP 8510 firmware to allow the correct format scaling in log magnitude is needed. This can be achieved by providing a "special" firmware version including format scaling in the standard firmware to provide real-time measurements. A similar firmware change is also needed in the HP 8757 scalar network analyzer system to provide real-time measurements. This need not be a soft key, as long as it can be accessed over HP-IB and can be saved with the instrument state.

The software should be able to identify the type of network analyzer used, and apply the proper correction routines. It may be possible, using an instrument state on a disk, and adaptive normalization (like interpolative calibration), to provide calibrated measurements over any frequency range without a controller.

Additionally, the calibration routines can be extended to more sources and receivers to provide multi-channel testing, if stand-alone lightwave source and/or lightwave receivers are utilized.

The lightwave test set 10 can also operate with the HP 8753 economy vector network analyzer system. The lightwave test set 10 can also be utilized with option H83 versions of the HP 8719 and with the HP 8720 vector network analyzer, in which a source tap is added before the R channel splitter available at the rear panel.

The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. A lightwave testing system, comprising:
   an RF network analyzer system comprising:
      an RF source for generating an electrical stimulus;
      an RF receiver and test set for sampling responses of a device under test connected to the test set; and
      signal processing and display means connected to the RF receiver for displaying processed sampled response data; and
   a lightwave test set, comprising:
      a lightwave receiver;
      an optical coupler;
      a light source;
      a leveled RF drive circuit connected to the RF source;
      an optical modulator connected to the light source and to the RF drive circuit; and
      means for deriving a reference signal proportional to the RF drive signal transmitted through the optical modulator to provide a phase lock and reference signal to the RF receiver of the RF network analyzer system;
      whereby the RF receiver of the RF network analyzer system is phase locked to the RF signal which drives the optical modulator, and the power in the RF receiver reference channel is proportional to the modulated optical power.

2. The lightwave testing system of claim 1, further comprising switch means interposed between the leveled RF drive circuit and the optical modulation for connecting the leveled RF drive circuit to the optical modulator and alternatively connecting the leveled RF drive circuit to a front panel output connector to provide a high-power RF output signal for testing electro-optical devices under test.

3. The lightwave testing system of claim 1, further comprising switch means in the lightwave test set to provide a standby condition, whereby the lightwave test set RF path is completely bypassed, and the RF network analyzer system operates as if no lightwave test set is present for testing electrical devices under test.

* * * * *